US012571119B2

(12) United States Patent
Bernt et al.

(10) Patent No.: US 12,571,119 B2
(45) Date of Patent: Mar. 10, 2026

(54) METHODS AND APPARATUS FOR ALTERING LITHOGRAPHIC PATTERNS TO ADJUST PLATING UNIFORMITY

(71) Applicant: Applied Materials, Inc., Santa Clara, CA (US)

(72) Inventors: Marvin Louis Bernt, Whitefish, MT (US); Jon Woodyard, Livermore, CA (US); Niranjan Khasgiwale, San Jose, CA (US); Vincent Dicaprio, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 471 days.

(21) Appl. No.: 18/118,336

(22) Filed: Mar. 7, 2023

(65) Prior Publication Data

US 2023/0304183 A1 Sep. 28, 2023

Related U.S. Application Data

(60) Provisional application No. 63/322,418, filed on Mar. 22, 2022.

(51) Int. Cl.
| | |
|---|---|
| *C25D 5/02* | (2006.01) |
| *C25D 17/00* | (2006.01) |

(Continued)

(52) U.S. Cl.
CPC ............. *C25D 5/022* (2013.01); *C25D 21/12* (2013.01); *G03F 1/70* (2013.01); *H01L 21/2885* (2013.01); *H01L 22/12* (2013.01); *C25D 17/001* (2013.01)

(58) Field of Classification Search
CPC .............................. C25D 21/12; C25D 17/001
See application file for complete search history.

(56) References Cited

U.S. PATENT DOCUMENTS

| | | |
|---|---|---|
| 6,493,867 B1 | 12/2002 | Mei et al. |
| 7,235,424 B2 | 6/2007 | Chen et al. |

(Continued)

FOREIGN PATENT DOCUMENTS

WO WO 2022-035708 A1 2/2022

OTHER PUBLICATIONS

International Search Report for PCT/US2023/015153, dated Jul. 13, 2023.

*Primary Examiner* — Brian W Cohen
(74) *Attorney, Agent, or Firm* — Moser Taboada

(57) ABSTRACT

Methods and apparatus for electroplating a substrate incorporate aspects of digital lithography and feedback from electroplating processes to improve characteristics of plating material based on die patterns. In some embodiments, a method of electroplating a substrate may include receiving a die design, forming a first lithographic pattern for a first substrate based on the die design, using a digital lithography process to pattern the first substrate with the first lithographic pattern, using an electroplating process to deposit material on the first substrate, using a metrology process to determine at least one parameter of the deposited material on the first substrate, and forming a second lithographic pattern from the first lithographic pattern for a second substrate based, at least in part, on the at least one parameter received directly from the metrology process on the first substrate by the digital lithographic process for the second substrate.

20 Claims, 4 Drawing Sheets

(51) Int. Cl.
    *C25D 21/12*      (2006.01)
    *G03F 1/70*       (2012.01)
    *H01L 21/288*     (2006.01)
    *H01L 21/66*      (2006.01)

(56)                References Cited

U.S. PATENT DOCUMENTS

| | | | |
|---|---|---|---|
| 9,070,752 B2 | 6/2015 | Hong et al. | |
| 9,633,915 B1 | 4/2017 | Park et al. | |
| 11,635,682 B2 * | 4/2023 | Volkovich | G03F 7/70525 |
| | | | 430/30 |
| 12,116,686 B2 * | 10/2024 | Bergman | C25D 17/001 |
| 2004/0214423 A1 | 10/2004 | Marxsen et al. | |
| 2009/0142860 A1 | 6/2009 | Ko et al. | |
| 2016/0345430 A1 | 11/2016 | Khan et al. | |
| 2022/0004096 A1 | 1/2022 | Volkovich et al. | |

* cited by examiner

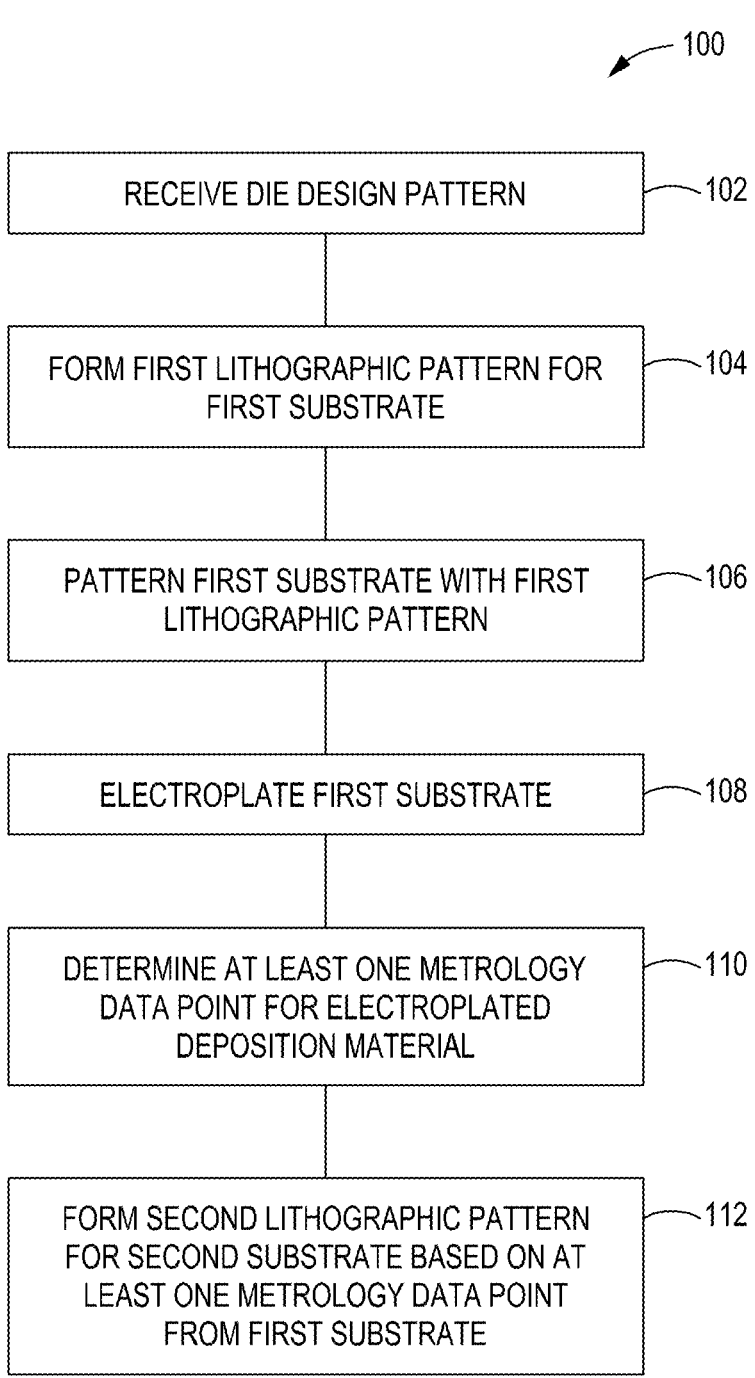

— 100

RECEIVE DIE DESIGN PATTERN — 102

FORM FIRST LITHOGRAPHIC PATTERN FOR FIRST SUBSTRATE — 104

PATTERN FIRST SUBSTRATE WITH FIRST LITHOGRAPHIC PATTERN — 106

ELECTROPLATE FIRST SUBSTRATE — 108

DETERMINE AT LEAST ONE METROLOGY DATA POINT FOR ELECTROPLATED DEPOSITION MATERIAL — 110

FORM SECOND LITHOGRAPHIC PATTERN FOR SECOND SUBSTRATE BASED ON AT LEAST ONE METROLOGY DATA POINT FROM FIRST SUBSTRATE — 112

FIGURE 1

METHODS AND APPARATUS FOR ALTERING LITHOGRAPHIC PATTERNS TO ADJUST PLATING UNIFORMITY

CROSS-REFERENCE TO RELATED APPLICATIONS

This application claims the benefit of U.S. provisional patent application Ser. No. 63/322,418, filed Mar. 22, 2022 which is herein incorporated by reference in its entirety.

FIELD

Embodiments of the present principles generally relate to semiconductor processing of semiconductor substrates.

BACKGROUND

Dies are designed and then multiple patterns of the dies are copied to a substrate. Oftentimes, the die patterns do not completely fill the available surface area of the substrate. When the substrate undergoes a plating process, the thickness of the deposited plating material may vary due to the underlying die patterns on the substrate. In traditional processes, extra copies of the die patterns or so-called dummy patterns may be placed in unused areas of the substrate to increase uniformity of the plating. However, the inventors have observed that the dummy patterns may not produce optimal uniformity of the plating thickness and are costly to produce for traditional stepper-based lithography processes.

Accordingly, the inventors have provided methods and apparatus to improve plating thickness uniformity.

SUMMARY

Methods and apparatus for altering plating thickness uniformity based on metrology data are provided herein.

In some embodiments, a method of electroplating a substrate may comprise receiving a die design, forming a first lithographic pattern for a first substrate based on the die design, using a digital lithography process to pattern the first substrate with the first lithographic pattern, using an electroplating process to deposit material on the first substrate with a first electroplating deposition uniformity, using a metrology process to determine at least one parameter of deposited material on the first substrate, and altering the first lithographic pattern to form a second lithographic pattern that adjusts the first electroplating deposition uniformity to a second electroplating deposition uniformity of the electroplating process for a second substrate based, at least in part, on the at least one parameter of deposited material from the metrology process on the first substrate.

In some embodiments, the method may further include using a substrate plating model based on metrology data associated with deposition by electroplating to facilitate in forming the first lithographic pattern for the first substrate or in forming the second lithographic pattern for the second substrate, wherein the substrate plating model includes pattern density data of the die design in forming the first lithographic pattern for the first substrate or in forming the second lithographic pattern for the second substrate, incorporating metrology data from electroplating processes into the die design prior to receiving the die design, wherein the first lithographic pattern includes active die patterns and a first set of dummy patterns and the second lithographic pattern includes the active die patterns and a second set of dummy patterns that alter at least one parameter of deposited material on the second substrate compared to the first substrate, wherein the first lithographic pattern includes active die patterns and the second lithographic pattern includes the active die patterns with at least one active die pattern in a different orientation that alters at least one parameter of deposited material on the second substrate compared to the first substrate, wherein the at least one parameter of deposited material is a thickness of deposited material at a specific location on the first substrate, wherein the first lithographic pattern or the second lithographic pattern has an edge region pattern different from a pattern used in a central region of the first substrate or the second substrate, and/or altering the first lithographic pattern or the second lithographic pattern based on a current flow of a plating bath used in the electroplating process.

In some embodiments, a non-transitory, computer readable medium having instructions stored thereon that, when executed, cause a method of electroplating a substrate to be performed, the method may comprise receiving a die design, forming a first lithographic pattern for a first substrate based on the die design, using a digital lithography process to pattern the first substrate with the first lithographic pattern, using an electroplating process to deposit material on the first substrate with a first electroplating deposition uniformity, using a metrology process to determine at least one parameter of deposited material on the first substrate, and altering the first lithographic pattern to form a second lithographic pattern that adjusts the first electroplating deposition uniformity to a second electroplating deposition uniformity of the electroplating process for a second substrate based, at least in part, on the at least one parameter of deposited material from the metrology process on the first substrate.

In some embodiments, the method of the non-transitory, computer readable medium may further include using a substrate plating model based on metrology data associated with deposition by electroplating to facilitate in forming the first lithographic pattern for the first substrate or in forming the second lithographic pattern for the second substrate, incorporating metrology data from electroplating processes into the die design prior to receiving the die design, wherein the first lithographic pattern includes active die patterns and a first set of dummy patterns and the second lithographic pattern includes the active die patterns and a second set of dummy patterns that alter the at least one parameter of deposited material on the second substrate compared to the first substrate, wherein the first lithographic pattern includes active die patterns and the second lithographic pattern includes the active die patterns with at least one active die pattern in a different orientation that alters the at least one parameter of deposited material on the second substrate compared to the first substrate, wherein the at least one parameter of deposited material is a thickness of deposited material at a specific location on the first substrate, wherein the first lithographic pattern or the second lithographic pattern has an edge region pattern different from a pattern used in a central region of the first substrate or the second substrate, and/or altering the first lithographic pattern or the second lithographic pattern based on a current flow of a plating bath used in the electroplating process.

In some embodiments, an apparatus for electroplating a substrate may comprise a substrate plating model on a processing unit that is configured to determine digital lithographic patterns that alter deposition characteristics of an electroplating process based on a die design, a digital lithography patterning tool configured to interact with, at least, the substrate plating model to form a lithographic pattern of active die patterns and dummy patterns on a first substrate based on the die design and deposition characteristics of the electroplating process, an electroplating tool configured to deposit a first plating material on the first substrate, and a metrology tool configured to determine deposition parameters of the first plating material on the first substrate, wherein the metrology tool interacts with the substrate plating model or the digital lithography patterning tool to provide the deposition parameters to alter the dummy patterns to change at least one parameter of a second plating material deposited on a second substrate.

In some embodiments, the apparatus may further include wherein the processing unit is part of the digital lithography patterning tool, and/or wherein the metrology tool is part of the electroplating tool.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 1 is a method of adjusting electroplating uniformity in accordance with some embodiments of the present principles.

Figure 2:
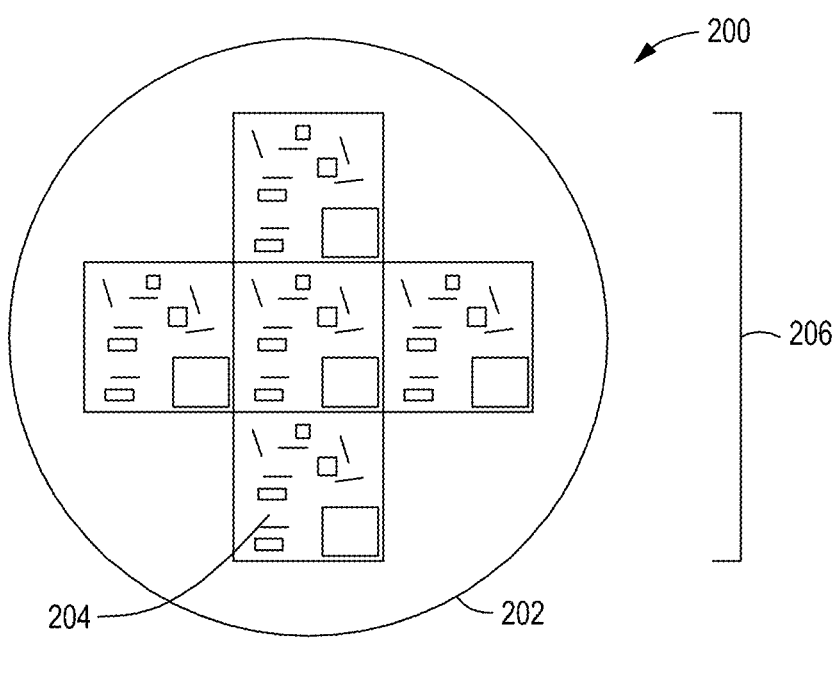
FIG. 2 depicts a top-down view of active die patterns on a substrate in accordance with some embodiments of the present principles.
Figure 3:
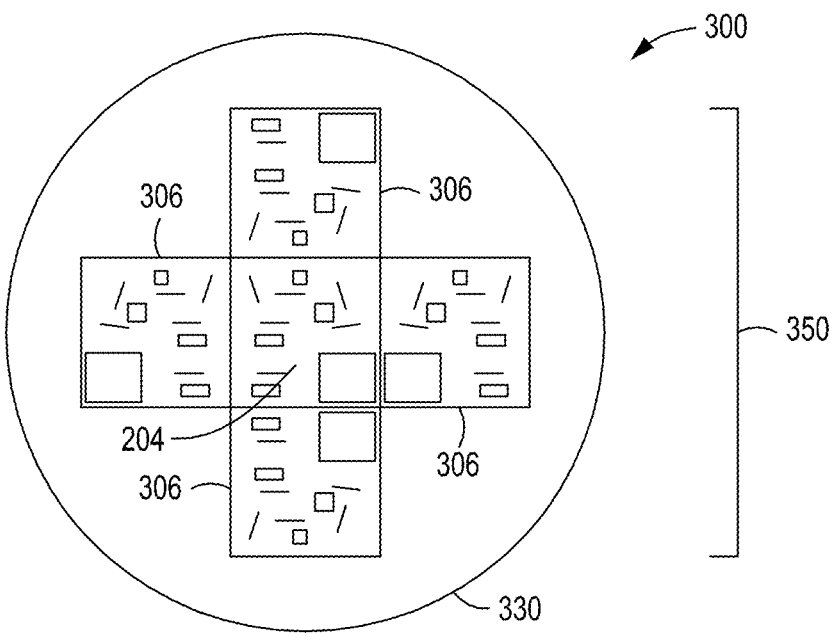
FIG. 3 depicts a top-down view of active die patterns with re-oriented active die patterns on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a capability for co-optimizing patterning and plating processes for improved deposition uniformity and film quality. The methods and apparatus incorporate maskless digital lithography and the ability to create customized dummy patterning (outside of the active dies). Modeling for plating uniformity provides customized design pattern files (e.g., Graphic Data System (GDS) files, etc.) in near real time for patterning. The present principles enable feedback from metrology for the next iteration with very fast learning cycle times. In traditional processes, the ability to create dummy patterns is limited to production mask patterns or other designed dummy masks. The techniques of the present principles improve greatly the flexibility and the speed of patterning of a substrate. The techniques provide very quick learning by feeding metrology results directly into the next pattern iteration (e.g., taking hours versus weeks for a new mask build) while significantly reducing costs by eliminating multiple mask sets per product. The techniques also have the advantage of easing new product dial-in by using internal modeling capability to define the next steps (e.g., pattern or tool parameters, etc.). A high level of uniformity also enables the elimination of planarizing processes during manufacturing.

To form redistribution layers and other structures, electroplating is often used to provide the base material for the conductive pathways. During electroplating, a uniform electrical field is created on the substrate—areas with less pattern density will have the same current as areas of high pattern density. The areas with less pattern density will plate more heavily than areas with high pattern density (more pattern to plate using the same amount of current means less plating occurs on dense patterns). Traditional processes use dummy patterning to improve plating uniformity by using iterations of the same product mask or a simple uniform array pattern to fill edge dead space on a substrate, causing thick plating from current crowding during plating deposition. The methods and apparatus of the present principles have the advantage of being able to create dummy patterns that accommodate density variations and die asymmetries on a substrate to increase plating thickness uniformity and quality. Unlike traditional processes where the patterning is predefined and rarely, if ever, corrected after an initial mask build, the present principles have the benefit of flexibility and easy pattern correction of observed issues. The methods and apparatus of the present principles leverage lithography and plating as a whole to allow co-optimization of the processes. Moving the pattern modeling optimization into the process line creates speed of learning cycles and extreme flexibility in creating and validating new solutions. The ability to input metrology results for the next patterning step is extremely advantageous over traditional processes which do not have the capability.

In some embodiments, the process, starting with a base die design (e.g., GDS files), a substrate plating model lays out a substrate configuration of active dies and dummy patterning to compensate for pattern density variations, pattern asymmetry, substrate or die layout asymmetry, and/or edge dead space. The digital lithography tool then exposes active dies onto a substrate in the prescribed array and adds dummy patterning to the substrate that is determined by the substrate plating model and/or another input. The first wafer is then processed-developed, plated, stripped, and then metrology performed to determine the quality and uniformity of the plating deposition. The metrology data is then input back into the substrate plating model and/or the digital lithography tool and a subsequent iteration of patterning/layout is made for a subsequent substrate.

FIG. 1 is a method 100 of adjusting electroplating uniformity in accordance with some embodiments. In block 102, an active die design is received that is to be used in a photolithography process to print a pattern of the die or 'active die' onto a first substrate. As used herein, 'active die' is a die or die pattern that is being formed on a substrate to create an actual semiconductor device, structure, or conductive pathway and like. A dummy die or dummy pattern is a full or partial die simulated circuit pattern that is not meant to be a working or active die. In block 104, the active die design 204 is used to form a first lithographic pattern 206 for the first substrate 202 as depicted in a view 200 of FIG. 2. In block 106, the first substrate 202 is patterned with the first lithographic pattern 206 that has a first electroplating deposition uniformity. In block 108, the first substrate 202 with the first lithographic pattern 206 is electroplated in, for example, a plating tank using current and a bath solution. In block 110, the plating deposition from the electroplating process, after any masking material has been stripped, undergoes metrology testing to determine at least one metrology data point for the electroplated deposition material. In some embodiments, the metrology data may include one or more locations at which thicknesses of the electroplating are measured. The metrology data may also comprise average or mean thicknesses of a plating material over a specific surface area at points on the first substrate and the like. The metrology data may be measured in situ with the electroplating chamber and/or in a separate process or chamber. In block 112, the first lithographic pattern is altered to form a second lithographic pattern 350, 450, 550, 650 (see, e.g., FIGS. 3-6) with a second electroplating deposition uniformity which is formed on a second substrate from at least one metrology data point obtained from the first substrate 202.

In some embodiments, the method 100 may be iterative and include several cycles to increase the electroplating uniformity to a predefined level. As such, the second lithographic pattern 350, 450, 550, 650 may become the initial or first lithographic pattern from which metrology data is gathered and fed back into the process. Several examples of pattern augmentations are depicted in FIGS. 3-6 which are described as "second lithographic patterns." The second lithographic patterns can also become "first lithographic patterns" for the sake of the method 100 when several iterations are performed to optimize the electroplating uniformity. The examples are selected for the sake of brevity and are not meant to be limiting in any fashion. In some embodiments, based on feedback from the metrology data gained through the method 100, the second lithographic pattern 350 on the second substrate 330 may be as depicted in a view 300 of FIG. 3 uses an active die design 204 that is flipped and/or rotated to form new orientation active die designs 306. By re-orienting the designs, variations in pattern density can be balanced to optimize plating uniformity for the active die design 204. For example, but not meant to be limiting, different pattern density areas of the die design can be located adjacent to each other (high density areas next to low density areas and low-density areas next to high density areas) to increase electroplating uniformity on the active die design 204.

Figure 4:
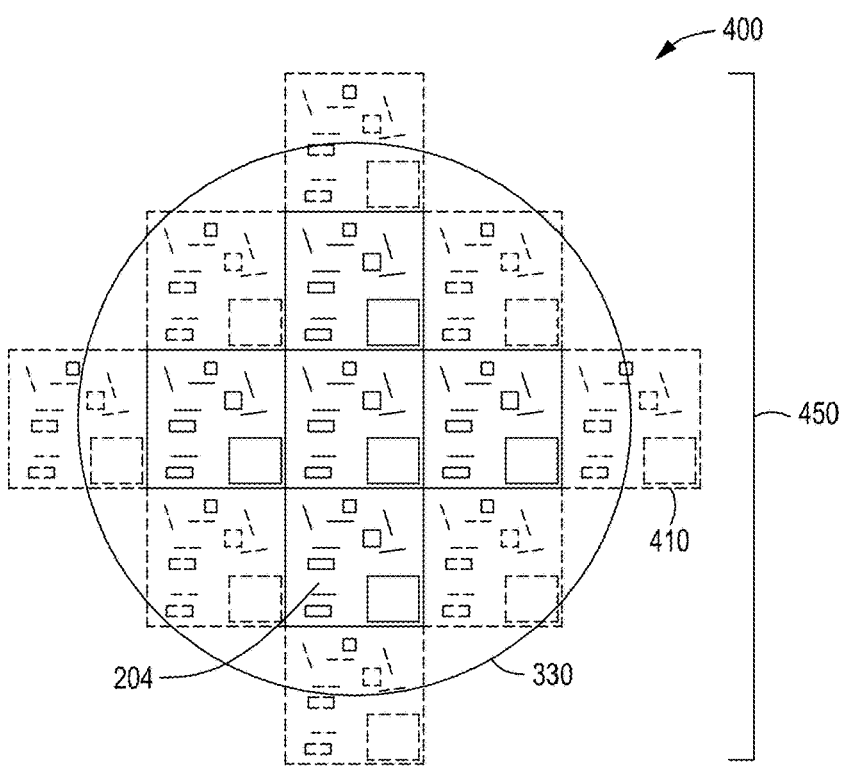
FIG. 4 depicts a top-down view of active die patterns and dummy die patterns on a substrate in accordance with some embodiments of the present principles.
Figure 5:
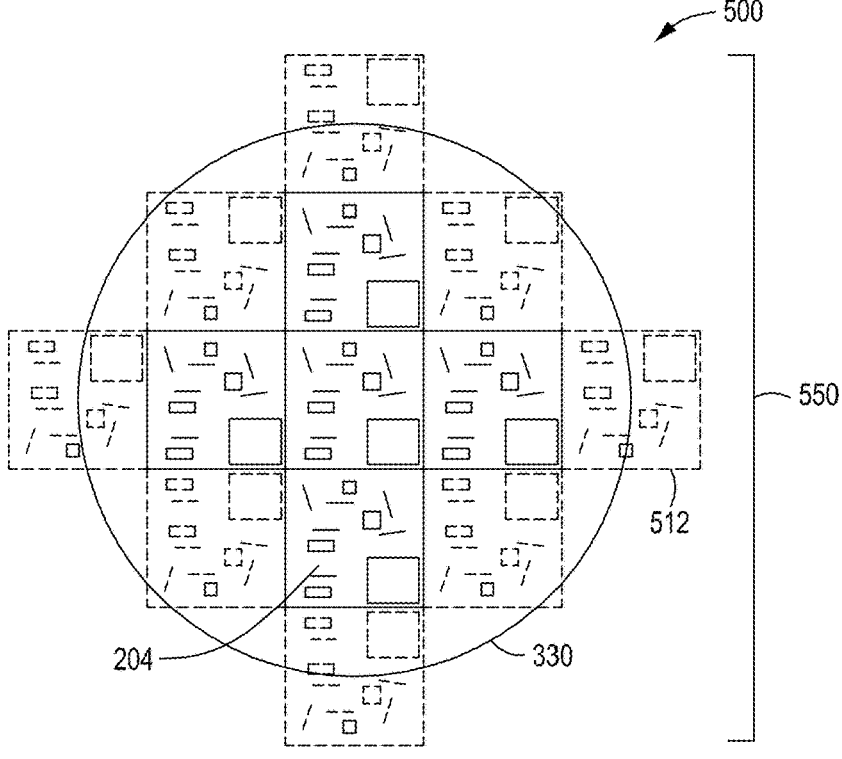
FIG. 5 depicts a top-down view of active die patterns and dummy die patterns with re-orientated dummy die patterns on a substrate in accordance with some embodiments of the present principles.
Figure 6:
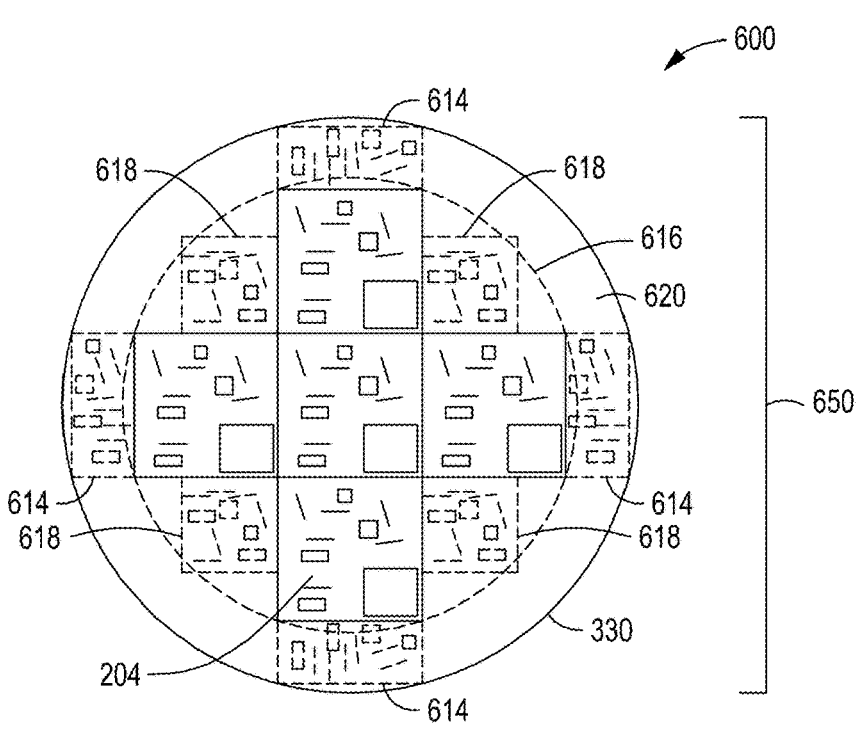
FIG. 6 depicts a top-down view of active die patterns and dummy die patterns that differ based on a central region or edge region on a substrate in accordance with some embodiments of the present principles.

In some embodiments, based on feedback from the metrology data gained through method 100, the second lithographic pattern 450 may be as depicted in a view 400 of FIG. 4. Dummy duplicate patterns 410 of the active die design 204 along with the active die design 204 are used to form the second lithographic pattern 450 on the second substrate 330. The added dummy duplicate patterns 410 facilitate in maintaining similar densities across the surface of the second substrate 330 to improve the electroplating uniformity. In some embodiments, based on the metrology data, re-oriented dummy duplicate patterns 512 may be used in conjunction with the active die design 204 as depicted in a view 500 of FIG. 5. As discussed above, the patterns, whether active or dummy, may be re-oriented to position like pattern density areas or different pattern density areas adjacent to each other to increase electroplating uniformity. In some embodiments, the surface area of the second substrate 330 may be divided into a central region 616 and an edge region 620 as depicted in a view 600 of FIG. 6. The second substrate 330 may also be divided into more than two regions. Central region dummy patterns 618 may be used in the central region 616 of the second substrate 330 and edge region dummy patterns 614 may be used in the edge region 620 of the second substrate 330. Using different dummy patterns in different regions of the substrate allows for greater flexibility in fine tuning the electroplating uniformity.

Figure 7:
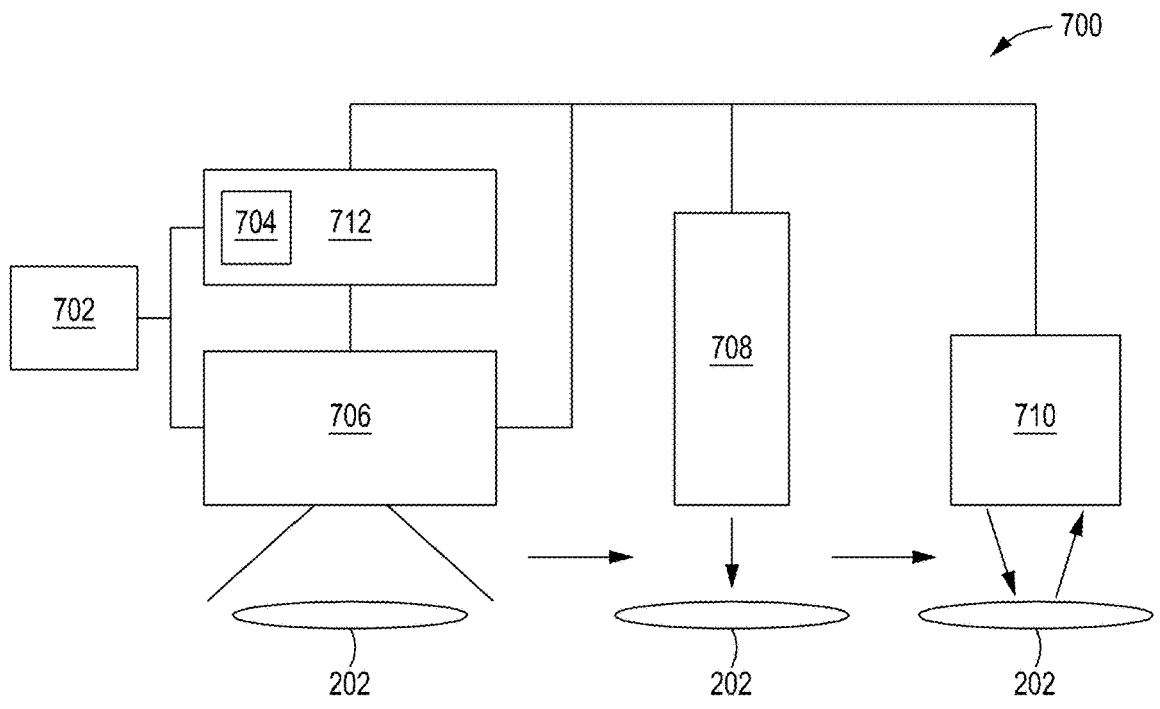
FIG. 7 depicts a cross-section view of an integrated tool set for adjusting electroplating uniformity in accordance with some embodiments of the present principles.

In a view 700 of FIG. 7, an integrated apparatus for adjusting electroplating on a substrate is depicted. An active die design 702 (GDS format file, etc.) is introduced into a digital lithography patterning tool 706 and/or a substrate plating model 704. The active die design 702 may also include dummy files and the like to alter electroplating uniformity at the start of the process. The substrate plating model 704 may reside on a processing unit 712 that is configured to determine digital lithographic patterns that alter deposition characteristics of an electroplating process based on a die design and/or a prior knowledge. The substrate plating model 704 may utilize machine learning and/or a set of rules to aid in establishing a lithographic pattern that optimizes electroplating on the substrate based on prior electroplating metrology data and/or lessons learned and the like. The substrate plating model 704 may also incorporate electroplating processing time, type of deposition material, solutions used in the plating bath during plating, electroplating hardware specifics (current values, plating rates, etc.) and the like to enhance the modeling process. In some embodiments, the substrate plating model 704 may be standalone, have a portion residing in the digital lithography patterning tool 706, or wholly within the digital lithography patterning tool 706. The digital lithography patterning tool 706 uses any a prior knowledge and/or rule sets, if available, to form the first lithographic pattern and then process the pattern onto the first substrate 202. The digital lithography patterning tool 706 may also accept user input to facilitate in forming the first lithographic pattern. In some embodiments, the digital lithography patterning tool 706 is configured to interact with, at least, the substrate plating model 704 to form a lithographic pattern of active die patterns and dummy patterns on a first substrate based on the die design and deposition characteristics of the electroplating process.

The first substrate 202 then moves to an electroplating tool 708 that is configured to deposit a plating material on the first substrate 202. In some embodiments, the electroplating tool 708 may be in communication with the substrate plating model 704 and/or the digital lithography patterning tool 706 to disclose operating parameters and the like such as deposition material, current settings, solutions used, etc. After the electroplating process, the first substrate 202 undergoes metrology testing. In some embodiments, the metrology testing may be accomplished in situ within the electroplating chamber or tool. The metrology tool 710 is configured to determine deposition parameters of the plating material on the first substrate 202. In some embodiments, the metrology tool 710 may interact with the substrate plating model 704 and/or the digital lithography patterning tool to provide the deposition parameters to alter the dummy patterns and/or active patterns to change at least one parameter of a subsequent plating material deposited on a second substrate (not shown). The use of digital lithography allows almost real time feedback of the plating process quality back into the substrate plating model 704 and/or the digital lithography patterning tool 706 to allow fast changes to the patterning of subsequent substrates without the costs of expensive and time-consuming masks.

A single digital pattern may be used in place of active die masks and dummy masks, eliminating mask alignment errors and costs associated with multiple masks. In addition, the ability to enhance the substrate plating model 704 with each run or iteration, allows the plating uniformity to be enhanced to high levels not easily achievable with traditional processes. The apparatus and methods of the present principles also allow for enhanced plating uniformity beyond the feedback of metrology data just to the substrate plating model 704 and the digital lithography patterning tool 706. Information gleaned from modeling and lessons learned can also be used to enhance plating uniformity by altering the active die design to enhance plating as well. Die designers can also use the acquired metrology data to design not only the active dies for a GDS file but design a pattern for an entire substrate to provide optimal plating uniformity at the first iteration of the methods described herein. Changes to plating contact positions on the substrates and the like can also be incorporated into the process to further enhance plating uniformity. In some embodiments, the contact positions may be aligned to enhance the current flow across the substrate based on the densities of the lithographic patterns.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of electroplating a substrate, comprising:
   receiving a die design;
   forming a first lithographic pattern for a first substrate based on the die design;
   using a digital lithography process to pattern the first substrate with the first lithographic pattern;
   using an electroplating process to deposit material on the first substrate with a first electroplating deposition uniformity;
   using a metrology process to determine at least one parameter of deposited material on the first substrate; and
   altering the first lithographic pattern with the digital lithography process to form a second lithographic pattern that adjusts the first electroplating deposition uniformity to a second electroplating deposition uniformity of the electroplating process for a second substrate based, at least in part, on the at least one parameter of deposited material received directly from the metrology process on the first substrate by the digital lithographic process for the second substrate.

2. The method of claim 1, further comprising:
   using a substrate plating model based on metrology data associated with deposition by electroplating to facilitate in forming the first lithographic pattern for the first substrate or in forming the second lithographic pattern for the second substrate.

3. The method of claim 2, wherein the substrate plating model includes pattern density data of the die design in forming the first lithographic pattern for the first substrate or in forming the second lithographic pattern for the second substrate.

4. The method of claim 1, further comprising:
   incorporating metrology data from electroplating processes into the die design prior to receiving the die design.

5. The method of claim 1, wherein the first lithographic pattern includes active die patterns and a first set of dummy patterns and the second lithographic pattern includes the active die patterns and a second set of dummy patterns that alter at least one parameter of deposited material on the second substrate compared to the first substrate.

6. The method of claim 1, wherein the first lithographic pattern includes active die patterns and the second lithographic pattern includes the active die patterns with at least one active die pattern in a different orientation that alters at least one parameter of deposited material on the second substrate compared to the first substrate.

7. The method of claim 1, wherein the at least one parameter of deposited material is a thickness of deposited material at a specific location on the first substrate.

8. The method of claim 1, wherein the first lithographic pattern or the second lithographic pattern has an edge region pattern different from a pattern used in a central region of the first substrate or the second substrate.

9. The method of claim 1, further comprising:
   altering the first lithographic pattern or the second lithographic pattern based on a current flow of a plating bath used in the electroplating process.

10. A non-transitory, computer readable medium having instructions stored thereon that, when executed, cause a method of electroplating a substrate to be performed, the method comprising:
    receiving a die design;
    forming a first lithographic pattern for a first substrate based on the die design;
    using a digital lithography process to pattern the first substrate with the first lithographic pattern;
    using an electroplating process to deposit material on the first substrate with a first electroplating deposition uniformity;
    using a metrology process to determine at least one parameter of deposited material on the first substrate; and
    altering the first lithographic pattern with the digital lithography process to form a second lithographic pattern that adjusts the first electroplating deposition uniformity to a second electroplating deposition uniformity of the electroplating process for a second substrate based, at least in part, on the at least one parameter of deposited material received directly from the metrology process on the first substrate by the digital lithographic process for the second substrate.

11. The non-transitory, computer readable medium of claim 10, the method further comprising:
    using a substrate plating model based on metrology data associated with deposition by electroplating to facilitate in forming the first lithographic pattern for the first substrate or in forming the second lithographic pattern for the second substrate.

12. The non-transitory, computer readable medium of claim 10, the method further comprising:

incorporating metrology data from electroplating processes into the die design prior to receiving the die design.

13. The non-transitory, computer readable medium of claim 10, wherein the first lithographic pattern includes active die patterns and a first set of dummy patterns and the second lithographic pattern includes the active die patterns and a second set of dummy patterns that alter the at least one parameter of deposited material on the second substrate compared to the first substrate.

14. The non-transitory, computer readable medium of claim 10, wherein the first lithographic pattern includes active die patterns and the second lithographic pattern includes the active die patterns with at least one active die pattern in a different orientation that alters the at least one parameter of deposited material on the second substrate compared to the first substrate.

15. The non-transitory, computer readable medium of claim 10, wherein the at least one parameter of deposited material is a thickness of deposited material at a specific location on the first substrate.

16. The non-transitory, computer readable medium of claim 10, wherein the first lithographic pattern or the second lithographic pattern has an edge region pattern different from a pattern used in a central region of the first substrate or the second substrate.

17. The non-transitory, computer readable medium of claim 10, the method further comprising:

altering the first lithographic pattern or the second lithographic pattern based on a current flow of a plating bath used in the electroplating process.

18. An apparatus for electroplating a substrate, comprising:

a substrate plating model on a processing unit that is configured to determine digital lithographic patterns that alter deposition characteristics of an electroplating process based on a die design;

a digital lithography patterning tool configured to interact with, at least, the substrate plating model to form a lithographic pattern of active die patterns and dummy patterns on a first substrate based on the die design and deposition characteristics of the electroplating process;

an electroplating tool configured to deposit a first plating material on the first substrate; and a metrology tool configured to determine deposition parameters of the first plating material on the first substrate, wherein the metrology tool interacts directly with the substrate plating model or the digital lithography patterning tool to provide the deposition parameters to alter the dummy patterns to change at least one parameter of a second plating material deposited on a second substrate.

19. The apparatus of claim 18, wherein the processing unit is part of the digital lithography patterning tool.

20. The apparatus of claim 18, wherein the metrology tool is part of the electroplating tool.

* * * * *